(12) United States Patent
Williams

(10) Patent No.: US 11,870,185 B2
(45) Date of Patent: Jan. 9, 2024

(54) ELECTRICAL INTERPOSER HAVING SHIELDED CONTACTS AND TRACES

(71) Applicant: GITech, Inc., Austin, TX (US)

(72) Inventor: John Williams, Austin, TX (US)

(73) Assignee: GITech, Inc., Austin, TX (US)

( * ) Notice: Subject to any disclaimer, the term of this patent is extended or adjusted under 35 U.S.C. 154(b) by 0 days.

(21) Appl. No.: 18/186,148

(22) Filed: Mar. 18, 2023

(65) Prior Publication Data

US 2023/0231343 A1 Jul. 20, 2023

Related U.S. Application Data

(63) Continuation of application No. 17/243,960, filed on Apr. 29, 2021, now Pat. No. 11,626,696.

(51) Int. Cl.
*H01R 13/6587* (2011.01)
*H01R 4/24* (2018.01)
*H01R 13/24* (2006.01)

(52) U.S. Cl.
CPC .......... *H01R 13/6587* (2013.01); *H01R 4/24* (2013.01); *H01R 13/2492* (2013.01)

(58) Field of Classification Search
CPC .. H01R 4/24; H01R 13/2492; H01R 13/6587; H01R 12/727; H01L 23/5382; H01L 23/49822; H05K 2201/10378; H05K 2201/093; H05K 1/44
See application file for complete search history.

(56) References Cited

U.S. PATENT DOCUMENTS

| | | | |
|---|---|---|---|
| 5,089,880 A | 2/1992 | Meyer |
| 5,404,044 A | 4/1995 | Booth |
| 6,172,305 B1 | 1/2001 | Tanahashi |
| 6,239,485 B1 | 5/2001 | Peters |
| 9,608,383 B2 | 3/2017 | Stokoe |

*Primary Examiner* — Vanessa Girardi

(57) ABSTRACT

A separable and reconnectable connector for semiconductor devices is provided that is scalable for devices having very small contact pitch. Connectors of the present disclosure include signal pins shielded by pins electrically-coupled to ground. One or more signal pins in a contact array are electrically-shielded by at least one ground pin coupled to a ground plane. Embodiments thereby provide signal pins, either single-ended or a differential pair, usable to transmit signals with reduced noise or cross-talk and thus improved signal integrity. Embodiments further provide inner ground planes coupled to connector ground pins to shield pairs of differential signal pins without increasing the size of the connector. Inner grounding layers can be formed within isolation substrates incorporated into connector embodiments between adjacent pairs of signal pins. These buried ground layers provide additional crosstalk isolation in close proximity to signal pins, resulting in improved signal integrity in a significantly reduced space.

21 Claims, 10 Drawing Sheets ions, there are many types of PCIe channels, from chip-to-chip topology without connectors to complex server topology with backplane interfaces that include multiple PCB cards and two or more connectors.

ELECTRICAL INTERPOSER HAVING SHIELDED CONTACTS AND TRACES

CROSS REFERENCE TO RELATED APPLICATIONS

This application is a continuation of U.S. patent application Ser. No. 17/243,960, entitled ELECTRICAL INTERPOSER HAVING SHIELDED CONTACTS AND TRACES, filed Apr. 29, 2021, which is incorporated herein by reference in its entirety.

FIELD

This disclosure relates generally to reconnectable and remountable electrical connectors, and more specifically, to an electrical interposer having shielded contact probes and traces for coupling two or more electronic components.

RELATED ART

Electrical interposers or connectors are used to connect two or more electronic components together or to connect an electronic component to a piece of electrical equipment, such as a computer, router, or tester. In one example, an electrical interposer or connector can be used to connect an electronic component, such as an integrated circuit (IC) package or chip to a printed circuit broad (PCB). In another example, an electrical interposer can also be used during integrated circuit manufacturing for coupling an IC device under test to a test system. In some applications, the electrical interposer or connector provides separable or remountable connection so that the attached electronic component can be removed and reattached. For example, it may be desirable to mount a packaged microprocessor chip to a personal computer mother board using a separable interconnect device so that a malfunctioning chip can be readily removed, or an upgraded chip can be readily installed.

Advances in semiconductor technologies have led to shrinking dimensions within integrated circuits and, particularly, decreasing pitch for the contact points on a silicon die or a semiconductor package. For example, contact pads on a semiconductor wafer can have a pitch of 250 microns or less. At a 500-micron package pitch level, conventional techniques to make separable electrical connections are prohibitively difficult and expensive. Issues become more critical as the pitch of contact pads on semiconductor packages decreases below 400 microns while simultaneous connection to multiple contact pads in an array is required.

High-speed communication applications further exacerbate issues associated with electrically coupling semiconductor devices. In high-speed applications, differential signal pairs normally cannot be placed in adjacent positions because noise easily transfers from one differential pair to a neighboring differential pair. Conventional PCIe connectors, for example, incorporate grounded contact elements positioned between every adjacent pair of differential signal pins to reduce crosstalk noise. This conventional method increases pin count and connector size and requires additional PCB area to incorporate the connection.

PCB traces, connectors, cables, and even IC packages are system-level bandwidth limiters that make designs at high data rates, such as PCIe, challenging. The high signal frequencies increase copper and power loss, which causes transmission distances to decrease. In addition, the channel loss in higher signal frequencies causes signal integrity issues. To meet the requirements of a wide range of appli-

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Figure 1:
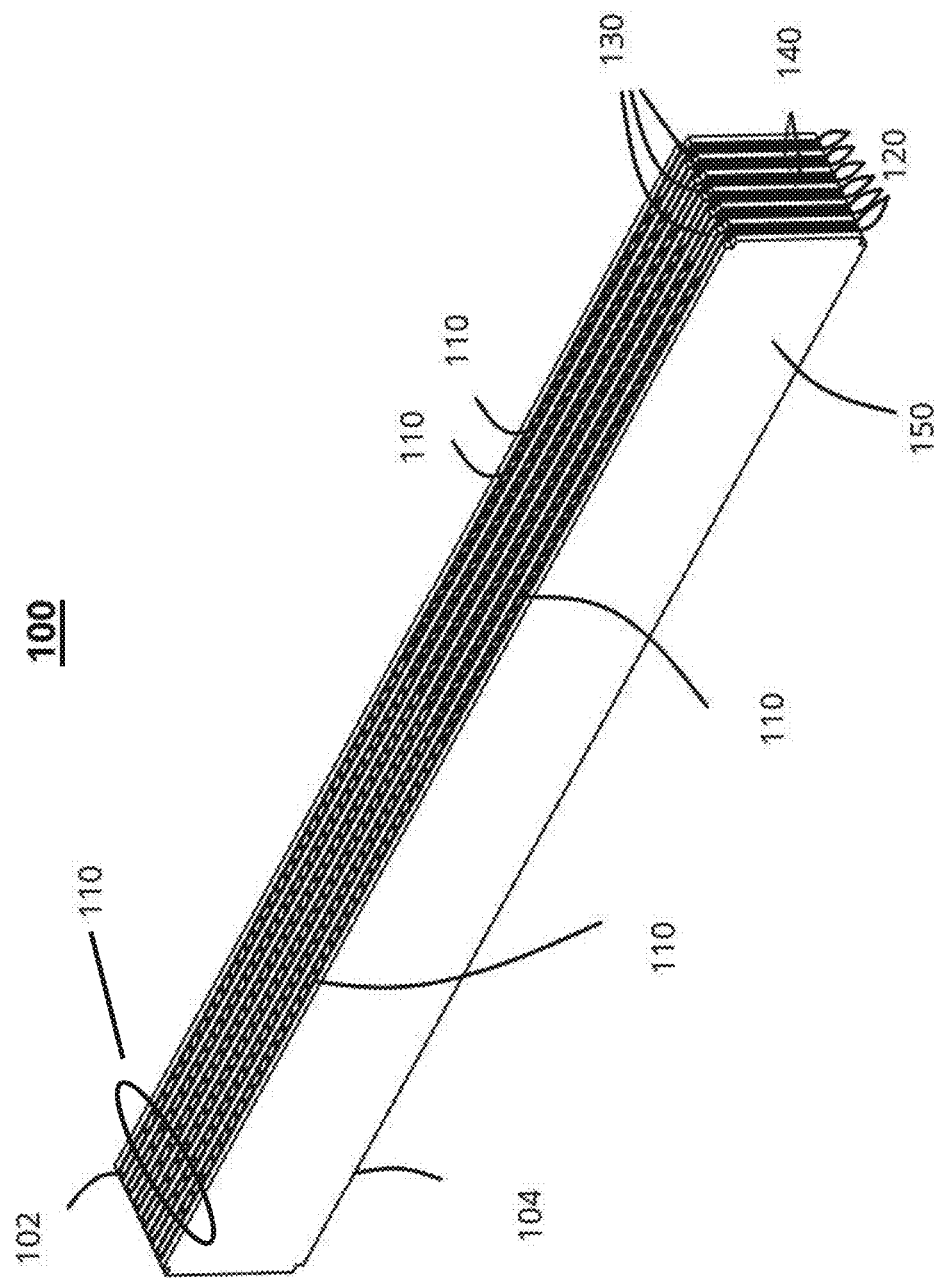
FIG. 1 is a simplified perspective view illustration of an interposer configured in accordance with an embodiment of the present invention.

Embodiments of the present invention provide a separable and reconnectable connector for semiconductor devices that is scalable for devices having very small contact pitch. The connectors of the present invention include signal pins shielded by pins electrically-coupled to ground. Embodiments provide one or more signal pins in a contact array electrically-shielded by at least one ground pin coupled to a ground plane. Embodiments thereby provide signal pins, either single-ended or a differential pair, usable to transmit signals with reduced noise or cross-talk and thus improved signal integrity. Embodiments further provide inner ground planes coupled to connector ground pins to shield pairs of differential signal pins without increasing the size of the connector. Inner grounding layers can be formed within isolation substrates incorporated into connector embodiments between adjacent pairs of signal pins. These buried ground layers provide additional crosstalk isolation in close proximity to signal pins, resulting in improved signal integrity in a significantly reduced space.

Electrical interposers or connectors are used to couple two or more electronic components together or to connect an electronic component to other electrical equipment. Depending on the nature of the application, it can be desirable to provide either a permanent or a separable coupling between the electronic components. The ability to make separable electrical connections with contacts of semiconductor scale electronic circuits has become increasingly challenging as mechanical, electrical, and reliability requirements of the electrical connections become more demanding. Nano springs, pogo pins, micro springs, and other miniature contact devices have been developed to make reliable electrical contact between semiconductor integrated circuits (ICs) or between an integrated circuit and an electronic system, such as one built on a printed circuit board (PCB). In some applications, conventional electrical connectors are made of stamped metal springs, which are formed and then individually inserted into an insulating carrier to form an array of electrical connector elements. Other approaches to providing electrical connectors have included anisotropically conductive adhesives, injection molded conductive adhesives, bundled wire conductive elements, springs formed by wire bonding techniques, and small solid pieces of metal.

Land grid arrays and ball grid arrays are different types of connector arrays commonly used for semiconductor device applications. A land grid array (LGA) refers to an array of metal pads, called lands, that are the electrical contact points on an IC package, a printed circuit board, or other electronic component. The metal pads are usually lithographically defined and etched on an isolating surface or substrate. It is common to then coat the exposed surface of the pads with a gold film or other noble metal to provide a non-oxidizing surface. A ball grid array (BGA) refers to an array of solder balls or solder bumps that are the electrical contact points for an IC package. Each of LGA and BGA packages has associated advantages or disadvantages. For instance, LGA packages are typically cheaper to manufacture than BGA packages because there is no need to form solder balls or solder bumps. But LGA packages are typically more difficult to couple onto a PC board or a multi-chip module. An LGA connector is usually needed to provide removable and remountable socketing capability for LGA packages.

Additionally, advances in semiconductor technologies have led to shrinking dimensions within ICs and, as a consequence, decreasing pitch for contact points on silicon die and semiconductor packages. Below 500μ pitch spacing, it can be prohibitively difficult and costly to use conventional techniques to provide separable connections. Embodiments of the present invention seek to address these issues.

Embodiments of the present invention provide an interposer, or connector, that can be used to make electrical connections from components such as a printed circuit board (PCB) to another PCB, to a system on a chip (SoC), such as a central processing unit, microprocessor, network processor unit, neural processing unit, or graphic processing unit, or other semiconductor device or package. The interposer or connector can be used to make electrical connections to electrical contact points formed on any electronic component. As discussed above, such electrical contact points can be an array of metal pads, such as an LGA or BGA or other types of contact points.

FIG. 1 is a perspective view illustration of an interposer 100 configured in accordance with an example embodiment of the present invention. Interposer 100 is configured to provide electrical conductivity from surface 102 to surface 104 using a conductor that extends from surface 102 as pins 110, through the body of interposer 100, and extending from surface 104 as corresponding pins (not shown). Throughout this disclosure, the terms "interposer" and "connector" are terms that refer to structure 100 and others providing similar functionality and may be used interchangeably. As will be discussed in greater detail below, interposer 100 includes a conductive contact array formed from a conductive layer 120 that is formed on a first major surface of an isolation substrate 130 and corresponding conductive contact array formed on another conductive layer 120 formed on a second major surface of the isolation substrate.

Figure 2:
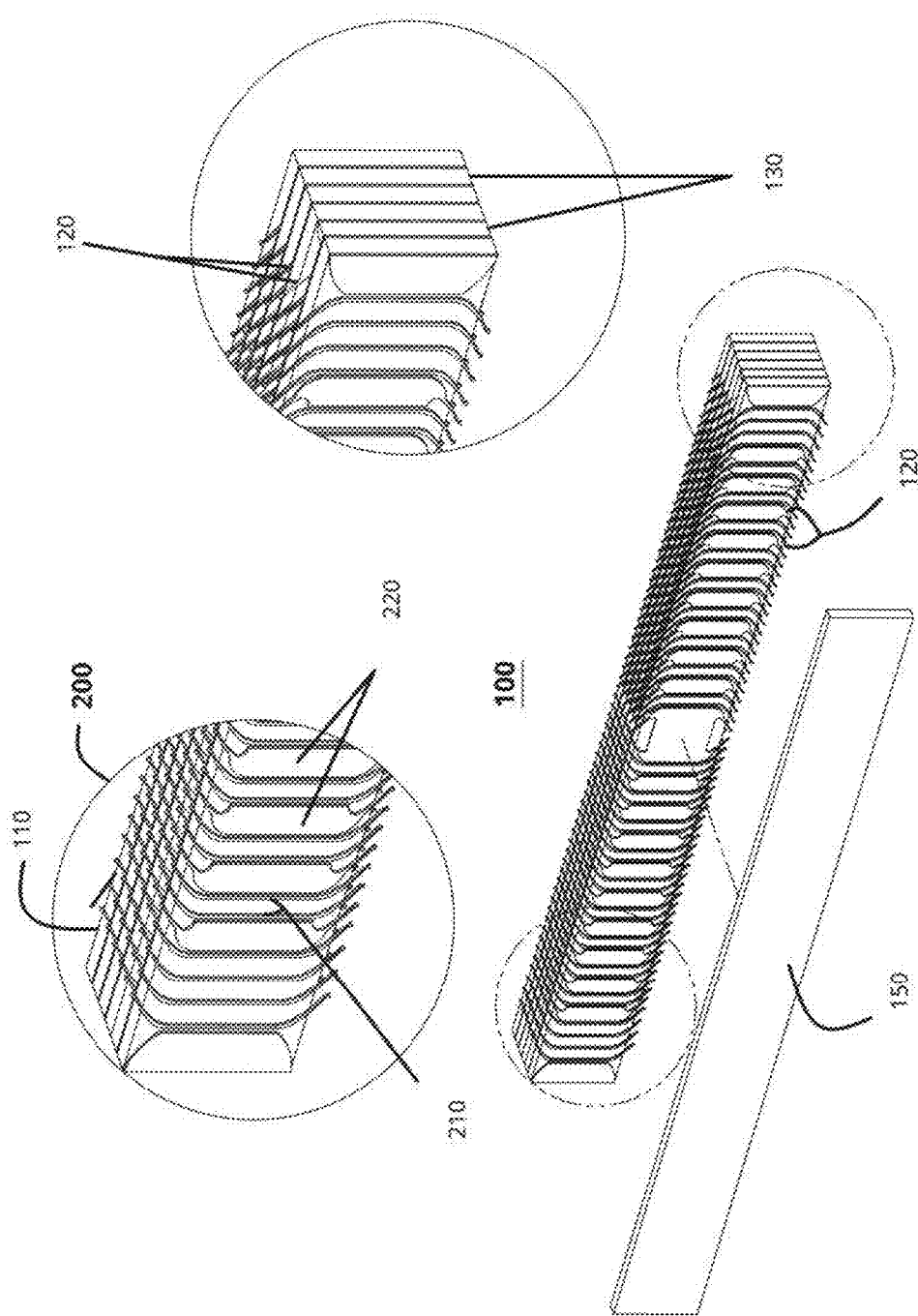
FIG. 2 is a simplified, exploded, perspective view illustration of an interposer configured in accordance with an embodiment of the present invention.

FIG. 2 is an exploded, perspective view illustration of interposer 100. An outer isolation layer 150 is removed from interposer 100 to reveal conductive contact array 200 formed from conductive layer 120. In this example embodiment, conductive contact array 200 is formed to provide differential pair conductors 210 separated by at least one ground pin 220. Each conductive layer 120 can be considered a signal layer separated by an inner isolation layer 130. Between each isolation layer 130 with conductive layers 120 formed thereon can be placed an additional isolation layer 140 (FIG. 1) for electrical separation. In one embodiment, conductive contact array 200 is formed as a two-dimensional array of conductive contact elements. This two-dimensional conductive array is illustrative only and embodiments are not limited to a two-dimensional array. Conductive array elements can be arranged in any configuration or design indicated for an application coupling components.

As will be discussed in greater detail below, for additional electrical isolation, shaped openings (e.g., vias) can be formed from the ground pins in the conductive array through the isolation substrate to a ground plane located either on or beneath the isolation substrate. Once electrically coupled to the ground plane, the ground pins can help reduce noise or cross-talk around high-speed signal lines.

As illustrated in FIGS. 1 and 2, the contact elements on conductive layer 120 (e.g., pins 110) are formed as conductive, compliant spring contact elements. In other embodiments, the contact elements can be formed as part of or to contact with a land grid array or a ball grid array. Other types of contact elements can be used depending upon the nature of the components which the interposer is intended to connect. In addition, the contact elements formed from the conductive layers need not be homogeneous. For example, the contact elements formed using a first conductive layer 120 can be of a first type (e.g., compliant spring elements) while the contact elements formed using a second conductive layer 120 can be of a second type (e.g., ball grid array contacts). The contact elements used for the contact array formed by the interposer can be selected in light of the type of contact structures on the components to which the interposer is to be coupled. In some embodiments, the contact elements can be single-ended, depending on the nature of the application. Conductive layer 120 can be formed from any type of conductive material that can provide a spring force. In some embodiments, conductive layer 120 is formed from copper or a copper alloy, such as, for example, beryllium copper. In other embodiments, conductive layer 120 can be formed from spring steel or another conductive metal or metal alloy.

In some embodiments, the isolation layers of the interposer (e.g., outer isolation layer 150 and inner isolation layers 130) are formed from printed circuit board (PCB) material. The material used in a PCB is chosen for the environment and application of the device design because the materials can affect thermal behavior as well as electrical and mechanical characteristics of the interposer. The range of materials for PCBs has grown over time, with circuit materials optimized for specific frequency ranges (e.g., millimeter-wave). Most PCB materials usable for embodiments can be classified as either a "hard" or rigid circuit material or a "soft" or flexible circuit material. Hard PCB materials are typically based on some form of a ceramic base, such as alumina, aluminum nitride, and beryllium oxide. Hard PCB materials can also serve as substrates for integrated circuits such as gallium arsenide, gallium nitride, silicon, and silicon carbide. Soft PCB materials are generally formed from a rubber-like material and are primarily used for RF applications. Such soft PCB materials can have an elastic modulus lower than 100 MPa, as compared to epoxy materials (5-20 GPa) and ceramics (>100 GPa).

Certain PCB materials are better suited for microwave and other high-frequency applications. For example, the popular glass-reinforced epoxy material called FR-4 is not well suited to certain applications due to a high dielectric loss at microwave frequencies. Such high losses can make FR-4 ill-suited for high-speed digital circuits or high-frequency analog applications above a few gigahertz. On the other hand, there are certain materials engineered for low dissipation factor at higher frequencies, such as flexible materials based on PTFE. In addition, less-flexible ceramic circuit materials, such as alumina, are used in millimeter-wave-frequency packaging and other infrastructure packaging due to being better suited for use with circuit transmission lines at microwave and millimeter-wave frequencies.

Figure 3:
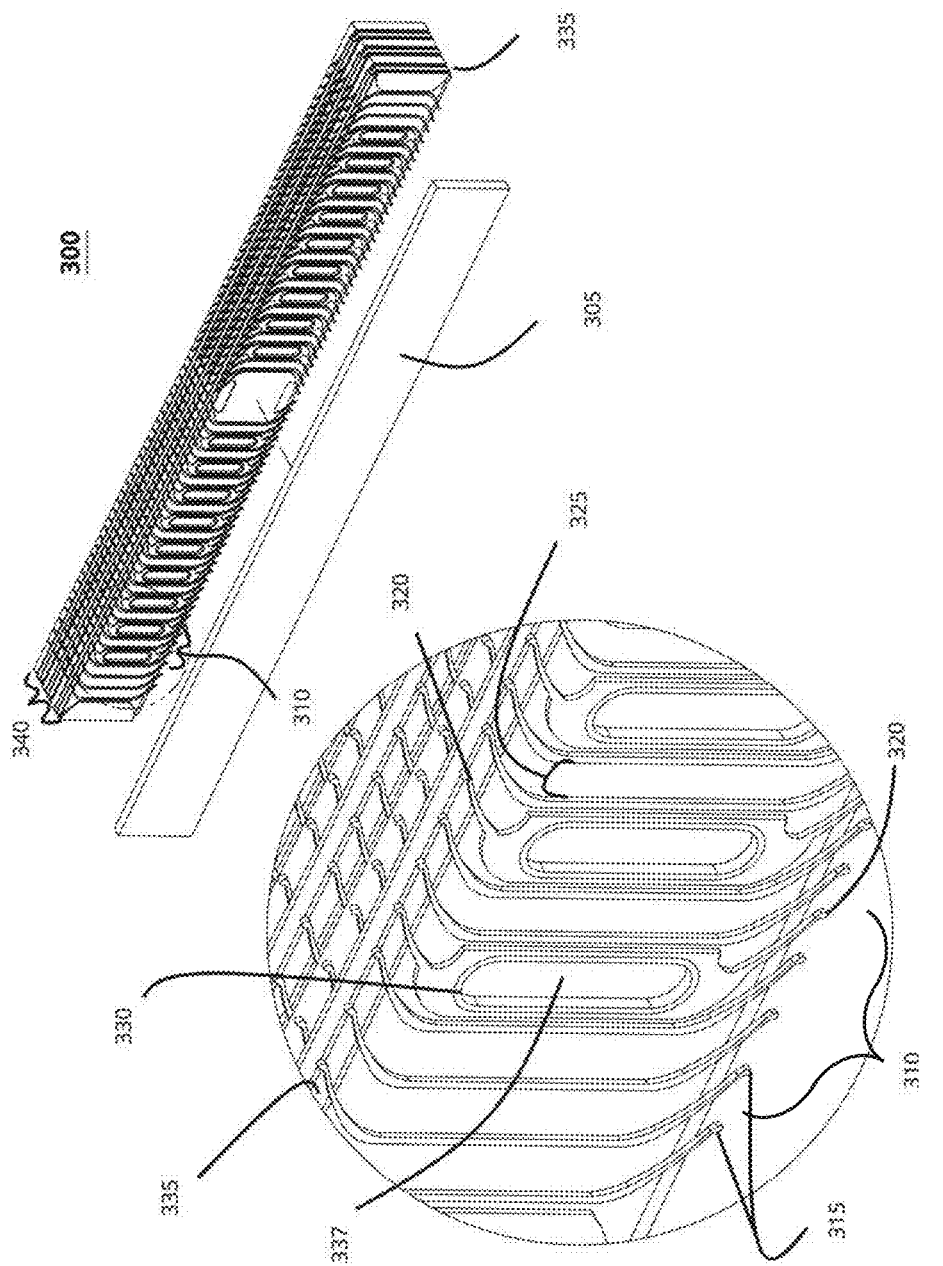
FIG. 3 is a simplified, exploded, perspective view illustration of an interposer configured in accordance with another example embodiment of the present invention.

FIG. 3 is an exploded, perspective view of an interposer 300 configured in accordance with an alternative example embodiment of the present invention. Outer isolation layer 305 is removed from interposer 300 to reveal a set of conductive contact arrays stacked to form the interposer. In this embodiment a contact array 310 is formed with signal conductors 315 and periodically placed ground probes or pins 320 between signal conductors forming a shielded differential pair (e.g., differential pair conductors 325). In the illustrated embodiment, a conductive conduit 330 is formed through a hole 337 in isolation layer 335 on which the contact array is formed. Conductive conduit 330 provides an electrical connection between corresponding conductive contact elements formed on the major surfaces of isolation layer 335 to one or more conductive planes formed either in or on isolation layer 335. By doing so, electrical shielding can be provided for high-speed signal pins while enabling a compact dimension for the interposer.

Conductive conduit 330 can be provided, for example, by providing a planar sheet of contact probes with specific geometric openings formed into a thin conductive plane or sheet of elastic material. Subsequent processing can allow the sheet of contact probes and openings to be registered and attached to an isolating substrate (e.g., 335) containing matching openings as those found on the conductive array of contact probes. Subsequent metallization couples the conductive spring sheet of probes to at least one ground plane. Spring elements can then be isolated into discrete contact probes or contact elements. This defines the basic building block of an interposer array block (e.g., 340) and will be subsequently referred to as an interposer unit. When combined with other interposer units, they form the basis of an interposer block of probe arrays.

Embodiments can provide contacts through the interposer for a variety of functions. In one embodiment, a subset of the contacts are signal (e.g., pins 315) or differential signal pins (e.g., pins 325) that include contact elements formed on the upper and lower isolation surfaces. Both signal and differential signal pins will be referred to as "signal pins," unless being specifically differentiated. In some embodiments, an interposer can be constructed having pairs of signal pins isolated by ground pins and inner ground planes, where the pairs of signal pins can be used to transmit a differential signal pair. In alternative embodiments, the interposer can be constructed for transmitting single-ended signals or open-ended signals. In such cases, a single signal pin is isolated by ground pins and internal ground planes connected to surface ground pins. Interposers can be formed to incorporate various pin and signal configurations as appropriate for a particular application.

Differential signal pins and other signal pins can be isolated from ground planes by the isolation layers (e.g., 335). In some embodiments, the interposer can include conductive openings 330 (e.g., "ground openings") configured to provide ground signal to ground plane connection. In some embodiments, each pair of signal pins forming a differential signal pair is provided with ground shielding, via ground pins or ground planes, to reduce crosstalk and improve signal integrity.

As illustrated, compliant spring contact elements are used for the top and bottom surface of the interposer block. As discussed above, embodiments of the present interposer are not limited to a particular type of contact element, and different types of contact elements can be used on the two surfaces of the interposer. It should also be noted that FIG. 3 is not intended to illustrate the actual order of elements or the actual construction of the interposer.

Figure 4:
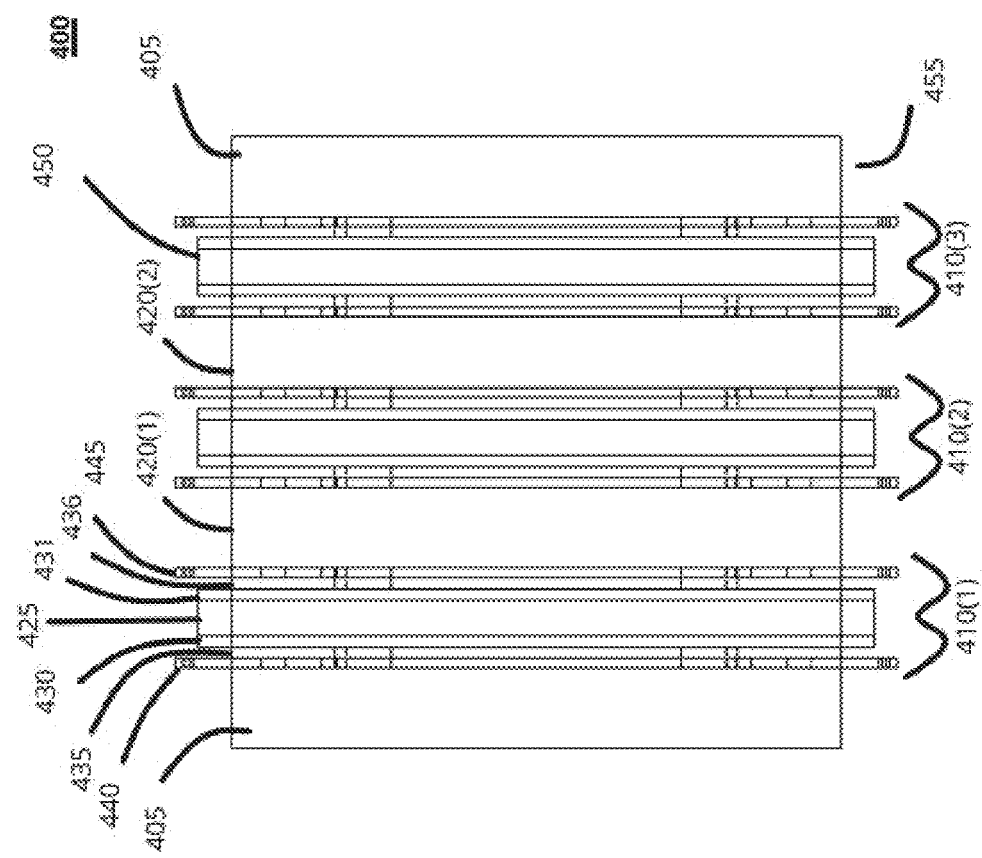
FIG. 4 is a simplified block diagram illustrating an end view of a contact array of an interposer constructed in accordance with embodiments of the present invention.

FIG. 4 is a simplified block diagram illustrating an end view of a contact array of an interposer 400 constructed in accordance with embodiments of the present invention. Interposer 400 includes outer isolation layers 405 protecting a set of interposer units 410(1)-(3). Interposer units 410(1)-(3) are separated by inner isolation layers 420(1)-(2). It should be understood that embodiments of the present invention are not limited to the illustrated number of interposer units or inner isolation layers, except that an inner isolation layer is used to separate two interposer units. Each interposer unit 410 is formed around an inner isolation layer 425 that has formed on opposing major surfaces conductive layers forming internal ground planes 430 and 431. On at least a portion of each major surface of internal ground planes 430 and 431 is formed an isolation layer 435 and 436, respectively. On the isolation layers 435 and 436 is formed conductive layers 440 and 445, respectively, which are formed into contact elements that provide signal pins or ground probes (e.g., 315, 320, and 325). When the interposer units are combined, they form the basis of an interposer array block to transport shielded signals between surfaces 450 and 455.

Figure 5:
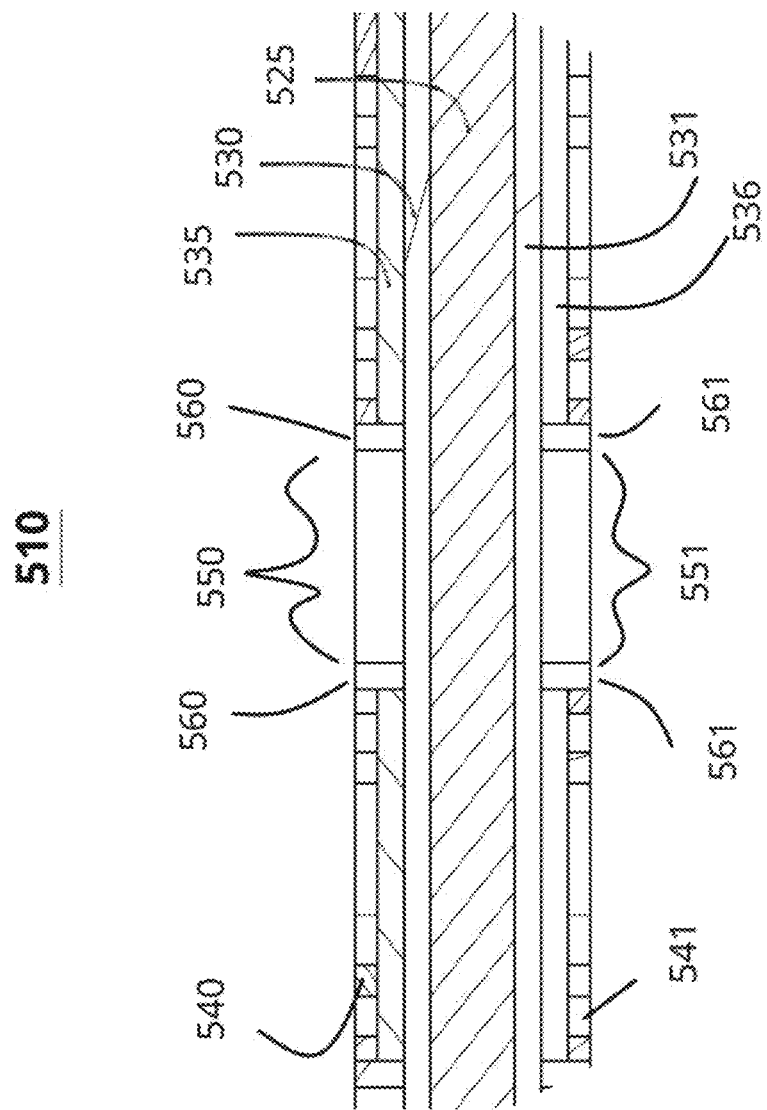
FIG. 5 is a simplified block diagram illustrating a cross-section through an example interposer unit configured in accordance with an embodiment of the present invention.

FIG. 5 is a simplified block diagram illustrating a cross-section through an example interposer unit 510 in accordance with an embodiment of the present invention. Interposer unit 510 corresponds to a unit of interposer 300 illustrated in FIG. 3. FIG. 5 provides an example illustration of an electrical coupling from a contact array layer to a ground plane layer of the interposer unit. As illustrated in FIG. 5, interposer unit 510 is formed around an internal isolation layer 525. On each major surface of internal isolation layer 525 is formed a conductive layer 530 and 531, respectively. In one embodiment, conductive layers 530 and 531 provide ground planes to enhance electrical isolation characteristics of interposer unit 510. On the major surfaces of conductive layers 530 and 531 are formed another internal isolation layer 535 and 536, respectively. Contact array layers 540 and 541 are formed on isolation layers 535 and 536, respectively.

As illustrated in FIG. 3, ground pins 320 are included in the contact array to aid in electrically isolating differential pair pins 325. Ground pins 320 can be electrically coupled to the ground planes formed in the interposer unit by providing an opening 550 through isolation layer 535 that corresponds to an opening 337 formed in ground pin 330, in contact array layer 540. Conductive plating 560 is formed on the walls of openings 337 and 550 to electrically couple the ground pin to the ground plane. As illustrated, a corresponding hole 551 and plating 561 is provided through contact array layer 541 and internal isolation layer 536 to couple a ground pin to ground plane 531. Multiple openings or vias can be provided for electrical coupling ground pins to a ground plane formed in the interposer unit. Alternative embodiments can also provide coupling to circuitry formed within an interposer unit from signal pins using vias through isolation layers.

Through the use of internal ground planes, the interposer can provide shielding to signal pins formed in the contact array layer. Differential pairs then can be placed directly adjacent to one another while still being electrically isolated through the ground shielding located within the interposer units. This permits the overall dimension of the interposer to be made more compact without sacrificing signal integrity. The contact array of pins is arranged such that each pair of differential pairs of signal pins is shielded from adjacent pairs of signal pints by at least one ground pin or at least one internal ground plane, or a combination thereof. In this manner, each differential pair of signal pins is shielded from adjacent differential pairs.

As illustrated in FIG. 5, the conductive openings or vias are formed in both the conductive contact array layer (e.g., 540) and the corresponding inner isolation layer (e.g., 535). The conductive conduit between a ground pin and the underlying conductive plane is formed as a conductive layer lining the sidewall of the opening formed in the isolation layer. The opening can remain hollow except for the conductive sidewall. In one example, the sidewall conductive layer can be a conductive layer formed by electroplating a conductive material such as, for example, copper, aluminum, tin, or any other conductive material. In other embodiments, a conductive link can be formed through the isolation layer using other conductive alternatives such as solder, metal plugs placed into openings in the isolation layer and coupled to one or more ground planes, or any other conductive element formed in the isolation layer and connected to the ground plane. In certain embodiment, the conductive element through the isolation layer can be any type of conductive interconnect formed through the isolation layer (e.g., a conductive via).

As illustrated in FIG. 5, an interposer unit can include an upper ground plane and a lower ground plane formed on the top and bottom opposing surfaces of the inner isolation substrate. In alternative embodiment, the interposer unit can incorporate other plane layer configurations, including, for example, ground planes, power planes, and thermal planes. Interconnect openings can be provided for coupling to any type of plane configuration, such as ground or power, from any other layer of the interposer unit. In certain embodiments, an interposer unit can incorporate a ground plane formed within an isolation unit instead of on a surface of an isolation substrate. In addition, an interposer can incorporate one or more conductive planes (e.g., ground planes) formed on a surface of an isolation substrate and within the isolation substrate. The buried conductive planes, functioning as ground planes, can provide crosstalk isolation in close proximity to the signal probes, which results in an improved signal integrity in a compact space. Embodiments of the present invention provide a connector formed in an area array configuration that enables a large number of differential signal pair connections, which can be valuable for applications such as PCIe.

Figure 6:
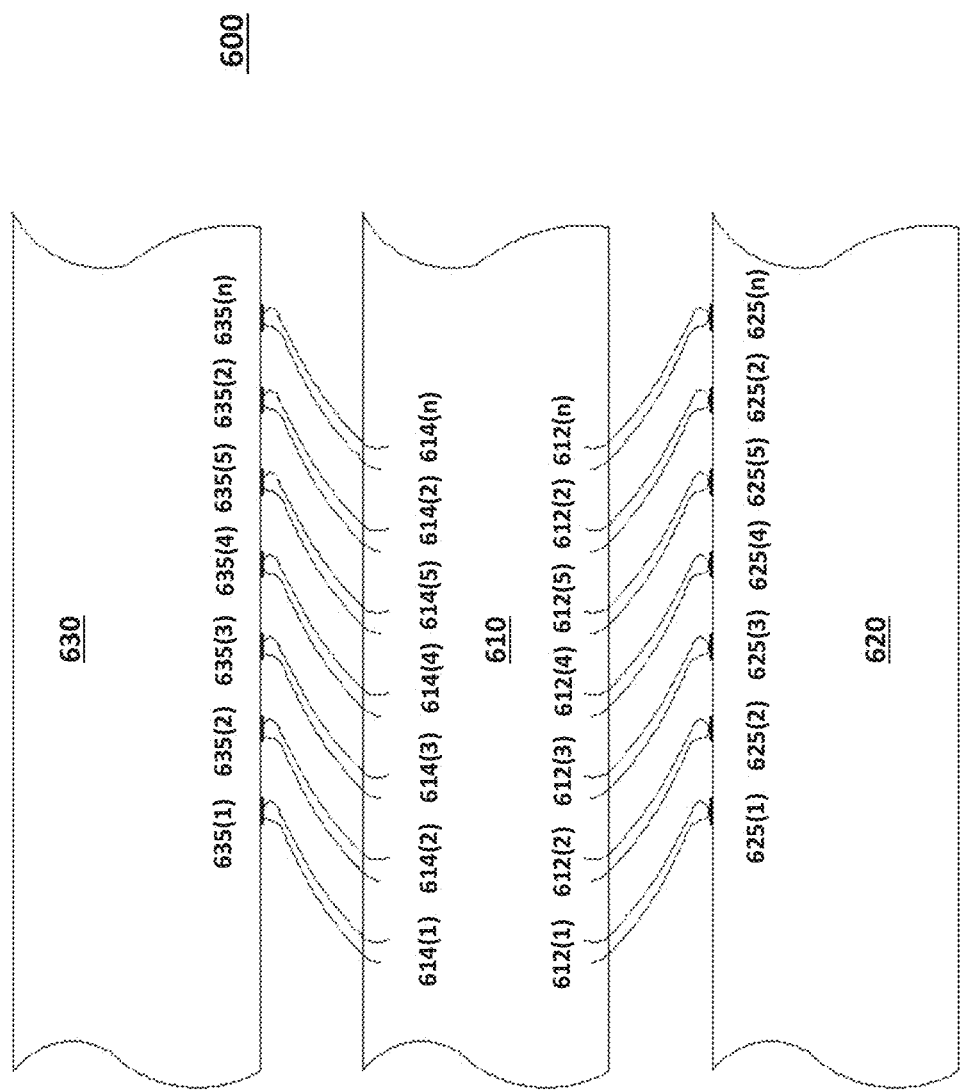
FIG. 6 is a simplified block diagram illustrating an example of an interposer coupling two semiconductor devices in accordance with embodiments of the present invention.

FIG. 6 is a simplified block diagram illustrating an example of an interposer coupling two semiconductor devices in accordance with embodiments of the present invention. An interposer 610 is configured to couple contact pads of a first semiconductor device 620 with contact pads of a second semiconductor device 630. A set of spring compliant contact pins 612 extend from interposer 610 into contact with a corresponding set of contact pads 625 of semiconductor device 620. Similarly, a set of spring compliant contact pins 614 extend from interposer 610 into contact with a corresponding set of contact pads 635 of semiconductor device 630. As illustrated above, the sets of contact pins from the interposer provide an electrical coupling between the contact pads of semiconductor devices 620 and 630. The spring compliant contact pins are held in place against the contact pads from pressure applied by a mechanical coupling holding the two semiconductor devices together (e.g., a screwed down heat shield or other type of frame). As discussed above, embodiments are not limited to the types of semiconductor devices 620 and 630, which can be a semiconductor package, PCB board, semiconductor device die, and the like.

Figure 7:
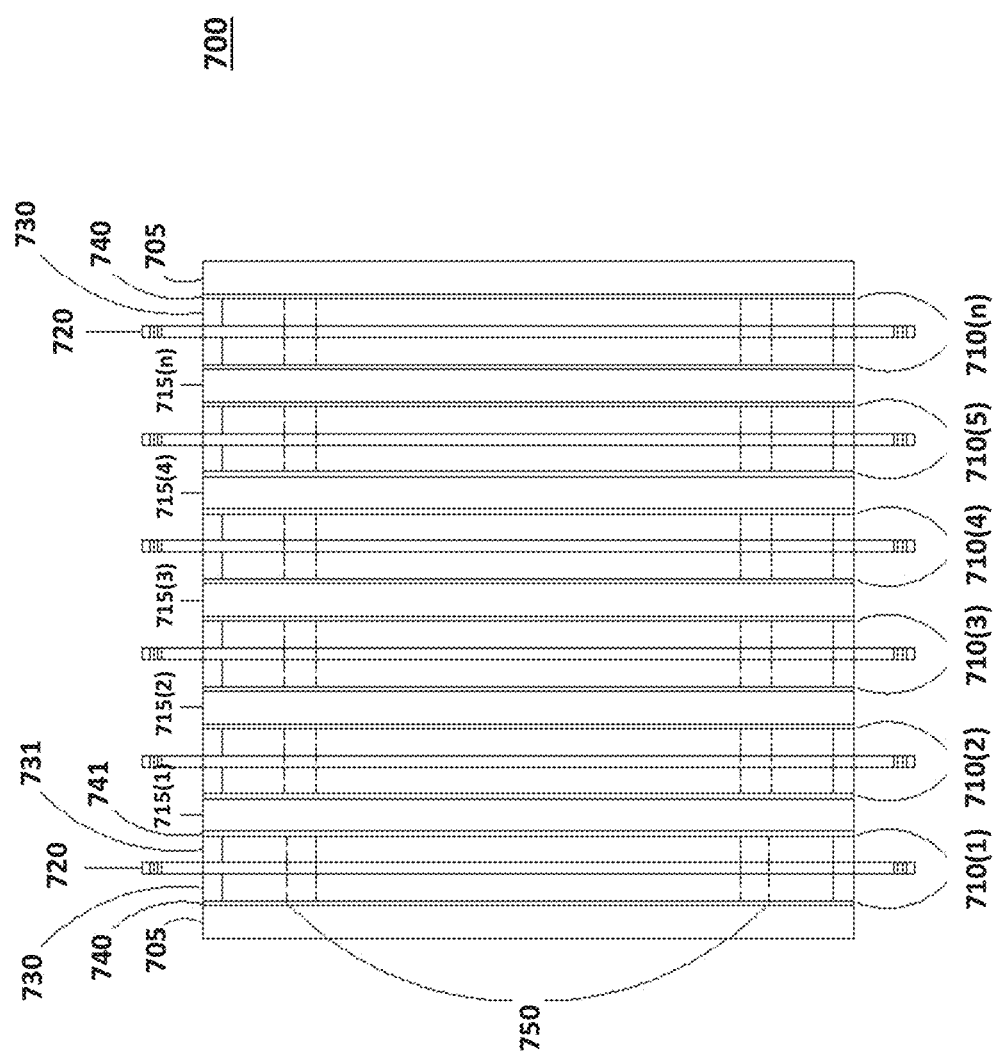
FIG. 7 is a simplified block diagram illustrating an end view of an alternative example of a contact array of an interposer constructed in accordance with embodiments of the present invention.

FIG. 7 is a simplified block diagram illustrating an end view of an alternative example of a contact array of an interposer 700 constructed in accordance with embodiments of the present invention. Interposer 700 includes outer isolation layers 705 protecting a set of interposer units 710(1)-(N). Interposer units 710(1)-(N) are separated by inner isolation layers 715(1)-(N−1). It should be understood that embodiments of the present invention are not limited to the illustrated number of interposer units or inner isolation layers. Each interposer unit 710 is formed around a conductive signal layer 720 that is placed or formed between isolation layers 730 and 731 on opposing major surfaces of conductive signal layer 720. The conductive signal layer is formed into contact elements that provide signal pins or ground probes (e.g., 315, 320, and 325). On the major surface of isolation layer 730 opposing the major surface in contact with conductive signal layer 720 is formed an internal ground plane 740. Similarly, on the major surface of isolation layer 731 opposing the major surface in contact with conductive signal layer 720 is formed an internal ground plane 741. On the major surfaces of the internal ground planes (740 and 741) opposing the isolation layers (730 and 731) are formed the isolation layers separating the interposer units (e.g., inner isolation layers 715) or protecting the outermost interposer units (e.g., outer isolation layer 705). As discussed above, there is also a set of orthogonal connection slots 750 between signal layer 720 and ground layers 740 and 741.

Embodiments incorporating the example of FIG. 7 can be used in applications in which enhanced electrical isolation is desired between conductors over, for example, the embodiment illustrated in FIG. 4. Internal ground planes 740 and 741 are in near proximity to signal pins formed in conductive signal layer 720. Each conductive signal layer is electrically isolated from each other conductive signal layer by two ground layers.

Figure 8:
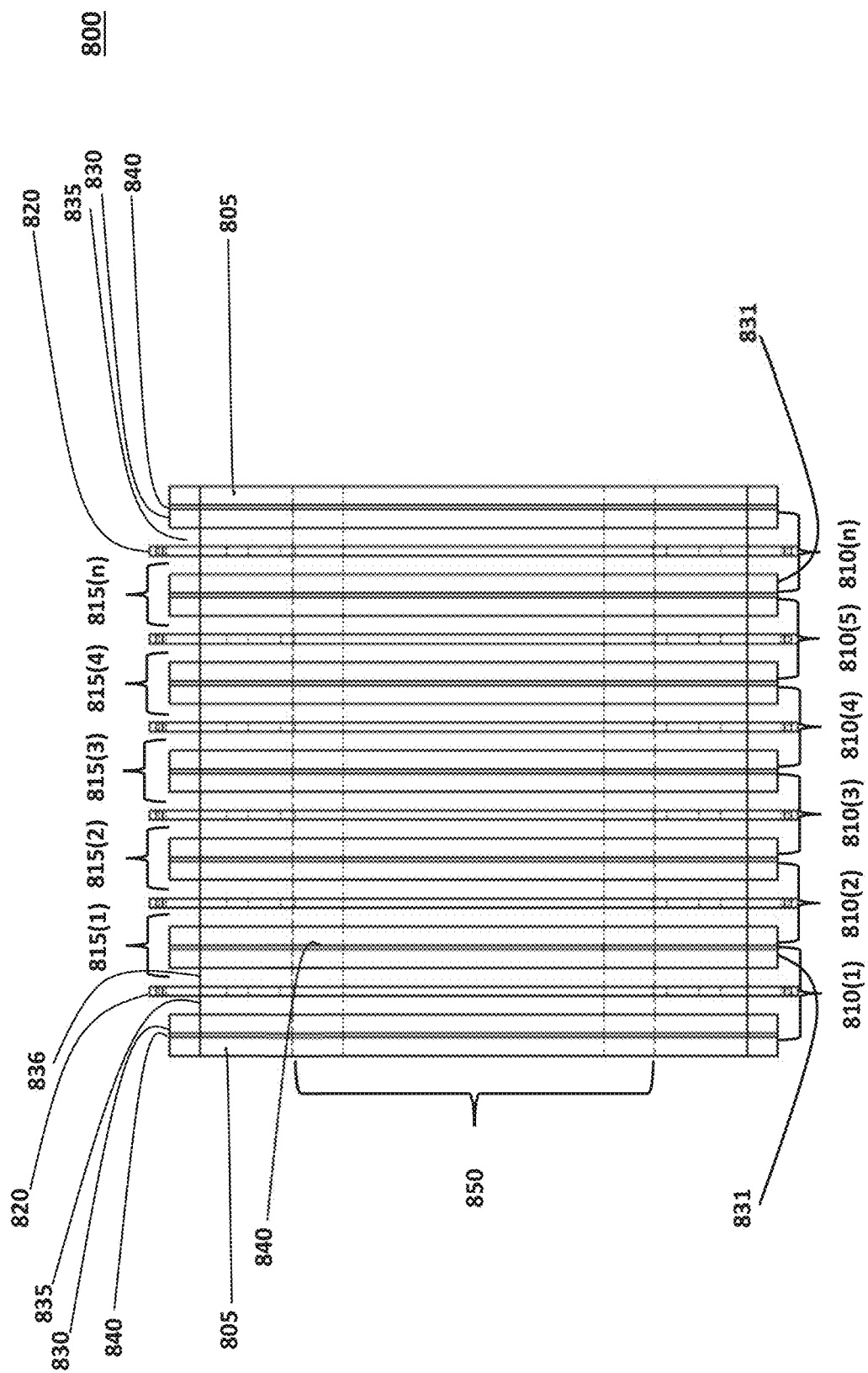
FIG. 8 is a simplified block diagram illustrating an end view of another alternative example of a contact array of an interposer constructed in accordance with embodiments of the present invention.

FIG. 8 is a simplified block diagram illustrating an end view of another alternative example of a contact array of an interposer 800 constructed in accordance with embodiments of the present invention. Interposer 800 includes outer isolation layers 805 protecting a set of interposer units 810(1)-(N). Unlike interposer 700, interposer units 810(1)-(N) do not include an additional inner isolation layer separating each unit, nor are two ground layers (e.g., 740 and 741) separating each signal layer. Instead, interposer units 810 share a ground layer that shields each interposer unit signal layer from a neighboring interposer unit signal layer. It should be understood that embodiments of the present invention are not limited to the illustrated number of interposer units or isolation layers.

Each interposer unit 810 is formed around a conductive signal layer 820 that is placed or formed between isolation layers 835 and 836 on opposing major surfaces of conductive signal layer 820. The conductive signal layer is formed into contact elements that provide signal pins or ground probes (e.g., 315, 320, and 325). On the major surface of isolation layer 835 opposing the major surface in contact with conductive signal layer 820 is formed another isolation layer 830. Similarly, on the major surface of isolation layer 836 opposing the major surface in contact with conductive signal layer 820 is formed another isolation layer 831. On the major surface of isolation layer 830 opposing the major surface in contact with isolation layer 835 is formed an internal ground plane 840. On the major surface of isolation layer 831 opposing the major surface in contact with isolation layer 836 is formed another ground plane 840 that is shared by a neighboring interposer unit (e.g., shared between 810(1) and 810(2)). Each region 815(1)-(n) includes the following layers: isolation layer 836, isolation layer 831, ground layer 840, isolation layer 830 and isolation layer 835. As discussed with regard to the above embodiments, there is also illustrated a set of orthogonal connection slots 850 between signal layer 820 and ground layers 840.

Isolation layers 830 and 831, along with internal ground plane 840, are formed such that when spring compliant signal pins formed by signal layer 820 are in compression, the internal ground plane electrically isolates each signal layer 820 from a neighboring signal layer 820. In this embodiment, isolation layers 835 and 836 function as stand-offs between a signal layer 820 and a corresponding internal ground plane 840. The combined thicknesses of the isolation layers (e.g., isolation layer 835 plus isolation layer 830 or isolation layer 836 plus isolation layer 831) is a capacitance gap for the signal layer and the ground plane and can be selected to alter the nature of the capacitance between those layers. It should also be appreciated that the material used to form the isolation layers can be the same or different, depending on the nature of the application, and can be selected to alter the nature of the capacitance between the signal layer and the ground plane.

Figure 9:
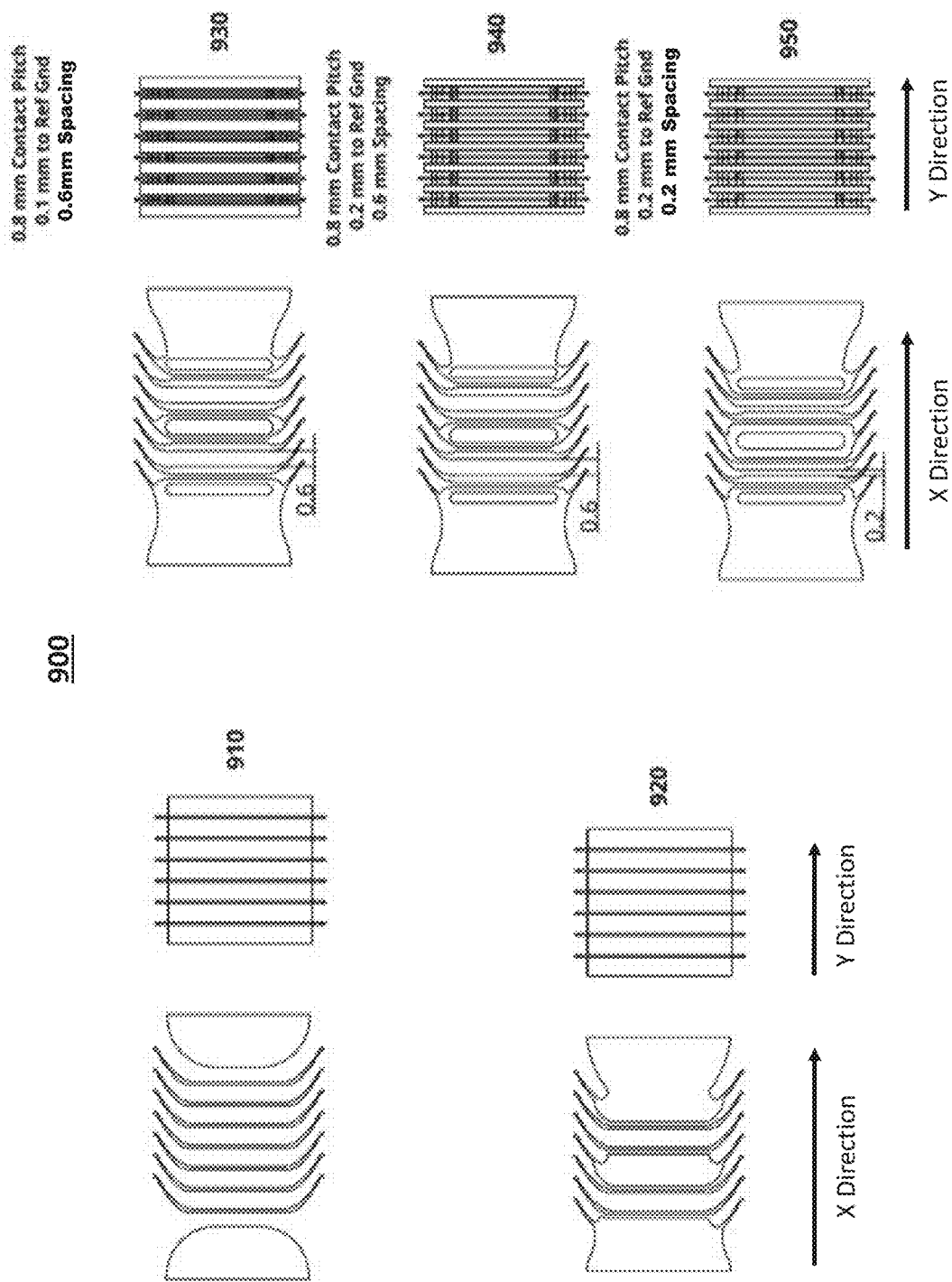
FIG. 9 is a simplified block diagram illustrating examples of signal line to ground line and ground plane spacing, in accordance with embodiments of the present invention.
Figure 10:
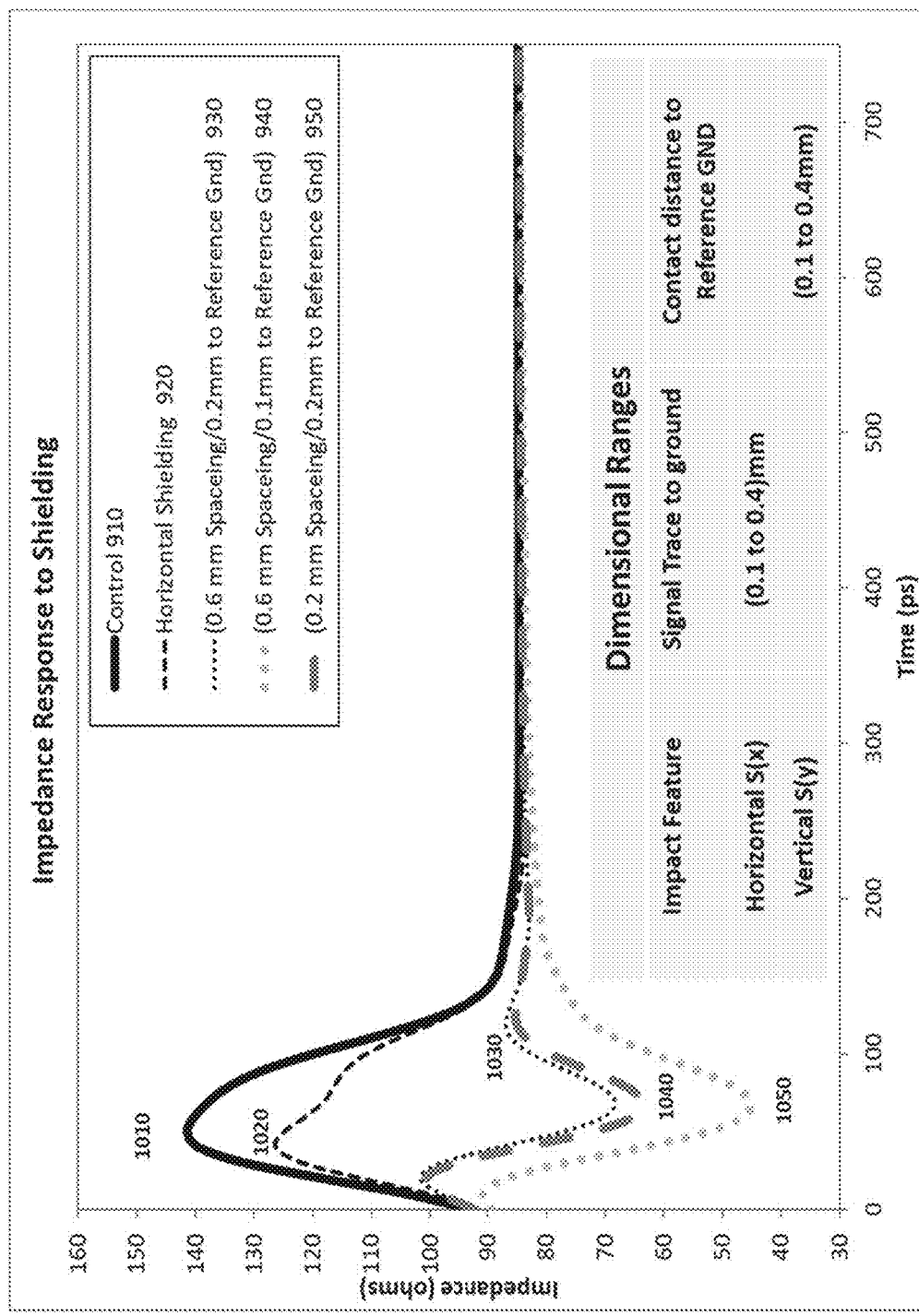
FIG. 10 is an example plot of baseline control impedance compared against other configurations, in accordance with embodiments of the present invention.

FIGS. 9 and 10 provide examples illustrating how spacing of signal lines to ground lines and ground planes can affect impedance response in differential pairs. FIG. 9 provides diagrams illustrating five examples of signal line to ground line and ground plane spacing. A control cell 910 provides an even spacing between signal and ground lines and no shielding between signal layers beyond a single isolation layer. Curve 1010 of FIG. 10 illustrates this as a baseline control with the highest impedance of the various configurations. A horizontally shielded cell 920 provides ground shielding between pairs of differential signal lines and no shielding between signal layers beyond a single isolation layer. Curve 1020 illustrates that there is a reduction in impedance over the control, but still a relatively high impedance compared with those cells configured with ground planes between the signal layers.

Cells 930 and 940 illustrate cells having the same horizontal shielding, where the differential signal pairs are shielded by an intervening ground pin. Each of the signal lines have a 0.6 mm spacing between them. In cell 930, interposer units have ground planes that are provided separated by a 0.1 mm isolation layer from the signal layer. Then an isolation layer is provided between interposer units. In cell 940, interposer units have ground planes that are provided separated by a 0.2 mm isolation layer from the signal layer. Then an isolation layer is provided between the interposer units. The vertical spacing between the signal layers is the same for each of cells 910, 920, 930, 940, and 950. As illustrated by curves 1030 and 1040, the impedance of both curves is significantly lower than those provided by cells with no vertical shielding. Further, there is sensitivity to the spacing of the ground planes from the signal layer, as curve 1040 exhibits less impedance than curve 1030.

Cell 950 provides a smaller spacing between signal lines of a differential signal pair. In cell 950, the pair spacing is 0.2 mm, while in cell 940 the pair spacing is 0.6 mm. Comparing curves 1050 and 1040 illustrates impedance sensitivity to the horizontal spacing, as the closer spacing of cell 950 results in an increased impedance over that associated with cell 940.

Embodiments of the present invention provide a compact, versatile mechanism for electrically coupling semiconductor devices together to exchange signals and power. Using a multi-layered approach, interposers configured in accord with the present disclosure can provide a high density, shielded set of signal conductors that can be configured in a variety of ways while providing a physically robust coupling. Embodiments further provide an ability to adjust spacing between signal lines and signal ground lines and ground planes, such that impedance response of the signal lines can be optimized for specific applications.

By now it should be appreciated that there has been provided an interposer connector for electrically coupling conductive structures formed on a first electronic component to conductive structures formed on a second electronic component. The interposer includes a first isolation layer including one or more holes extending from a first major surface of the first isolation layer to a second major surface of the first isolation layer, a first conductive layer provided adjacent to and having a first major surface in contact with the first major surface of the first isolation layer, a first set of ground contact elements provided on the second major surface of the first isolation layer where each of the first set of ground contacts are in electrical contact with the first conductive layer using a corresponding conductor provided in a hole of the one or more holes through the first isolation layer, a second set of ground contact elements provided on the second major surface of the first isolation layer, a first set of signal contact elements provided on the second major surface of the first isolation layer where a signal contact element of the first set of signal contact elements is placed near to but electrically isolated from a ground contact element that is a member of the first or second set of ground contact elements, a second isolation layer including one or more holes extending from a first major surface of the second isolation layer to a second major surface of the second isolation layer where the second isolation layer is provided such that the first major surface of the second isolation layer is in contact with the first and second set of ground contact elements and the first set of signal contact elements, and a second conductive layer provided adjacent to and having a first major surface in contact with the second major surface of the second isolation layer where each of the second set of ground contact elements are in electrical contact with the second conductive layer using a corresponding conductor provided in a hole of the one or more holes through the second isolation layer.

In one aspect of the above embodiment, the first conductive layer is configured as a ground plane. In another aspect of the above embodiment, the second conductive layer is configured as a ground plane. In yet another aspect of the above embodiment, the signal contact element is electrically isolated from the first and second conductive layers. In still another aspect of the above embodiment, the conductor formed in the hole includes a conductive plating formed on side walls of the hole. In yet another aspect of the above embodiment, the conductor formed in the hole includes a conductive via a formed within the hole.

In another aspect of the above embodiment, the interposer includes a plurality of interposer units. Each interposer unit includes the first isolation layer, the first conductive layer, the first set of ground contact elements, the second set of ground contact elements, the first set of signal contact elements, the second isolation layer, and the second conductive layer. In a further aspect, the interposer also includes an inner isolation layer formed between neighboring interposer units. A first major surface of the inner isolation layer is in contact with a second major surface of the second conductive layer of a first interposer unit of the neighboring interposer units. A second major surface of the inner isolation layer is in contact with a second major surface of the first conductive layer of a second interposer unit of the neighboring interposer units. In another further aspect, the interposer further includes an outer isolation layer formed with a major surface in contact with one of a second major surface of the first conductive layer or a second major surface of the second conductive layer where an opposing major surface of the contacting major surface is not in contact with another layer.

In another aspect of the above embodiment, the interposer further includes a plurality of interposer units. Each interposer unit includes the first isolation layer, the first conductive layer, the first set of ground contact elements, the second set of ground contact elements, the first set of signal contact elements, and the second isolation layer. The first isolation layer includes first and second isolation sub layers, where a first major surface of the first isolation sub layer forms the first major surface of the first isolation layer, and a first major surface of the second isolation sub layer forms the second major surface of the first isolation layer. The second isolation layer includes third and fourth isolation sub layers, where a first major surface of the third isolation sublayer forms the first major surface of the second isolation layer, and a first major surface of the fourth isolation sublayer forms the second major surface of the second isolation layer. A first interposer unit is formed directly adjacent to a second interposer unit. In a further aspect, the interposer further includes an outer isolation layer formed with a major surface in contact with one of a second major surface of the first conductive layer or a second major surface of the second conductive layer where an opposing major surface of the contacting major surface is not in contact with another layer. In yet another further aspect, at least a part of a second major surface of the first isolation sublayer is in contact with a second major surface of the second isolation sublayer and at least a part of a second major surface of the third isolation sublayer is in contact with a second major surface of the fourth isolation sublayer.

In another aspect of the above embodiment, a signal contact element to the first set of signal contact elements is configured to physically contact a conductive structure the first electronic component, physically contact a conductive structure of the second electronic component, and electrically coupled conductive structure the first electronic component to the conductive structure of the second electronic component. In still another aspect of the above embodiment, the first isolation layer includes a printed circuit board substrate. In yet another aspect of the above embodiment, a first set of one or more signal pads of a first semiconductor device are placed in contact with corresponding signal contact elements of the first set of signal contact elements, a first set of one or more signal pads of a second semiconductor device are placed in contact with corresponding signal contact elements of the first set of signal contact elements, and the interposer is configured to provide a signal path from a signal pad of the first semiconductor device to a signal pad of the second semiconductor device.

A second embodiment provides an electronic device that includes a first electronic component including a first plurality of conductive structures on a first major surface of the first electronic component, a second electronic component including a second plurality of conductive structures on a first major surface of the second electronic component, and an interposer that electrically couples one or more of the first plurality of conductive structures to corresponding conductive structures of the second plurality of conductive structures. The interposer includes a first isolation layer including one or more holes extending from a first major surface of the first isolation layer to a second major surface of the first isolation layer, a first conductive layer provided adjacent to and having a first major surface in contact with the first major surface of the first isolation layer, a first set of ground contact elements provided on the second major surface of the first isolation layer where each of the first set of ground contact elements are in electrical contact with the first conductive layer using a corresponding conductor provided in a hole of the one or more holes through the first isolation layer, a second set of ground contact elements provided on the second major surface of the first isolation layer, a first set of signal contact elements provided on the second major surface of the first isolation layer where a signal contact element to the first set of signal contact elements is placed near to but electrically isolated from a ground contact element that is a member of the first or second set of ground contact elements, a second isolation layer including one or more holes extending from a first major surface of the second isolation layer to a second major surface of the second isolation layer where the second isolation layer is provided such that the first major surface of the second isolation layer is in contact with the first and second set of ground contact elements and the first set of signal contact elements, and a second conductive layer provided adjacent to and having a first major surface in contact with the second major surface of the second isolation layer where each of the second set of ground contact elements are in electrical contact with the second conductive layer using a corresponding conductor provided in a hole of the one or more holes through the second isolation layer.

In one aspect of the above embodiment, the interposer further includes a plurality of interposer units. Each interposer unit includes the first isolation layer, the first conductive layer, the first set of ground contact elements, the second set of ground contact elements, the first set of signal contact elements, the second isolation layer, and the second conductive layer. In a further aspect, the interposer further includes an inner isolation layer formed between neighboring interposer units. And a second major surface of the inner isolation layer is in contact with a second major surface of the first conductive layer of a second interposer unit of the neighboring interposer units. In still a further aspect, the interposer further includes an outer isolation layer formed with a major surface in contact with one of a second major surface of the first conductive layer or a second major surface of the second conductive layer where an opposing major surface of the contacting major surface is not in contact with another layer.

In another aspect of the above embodiment, the interposer further includes a plurality of interposer units. Each interposer unit includes the first isolation layer, the first conductive layer, the first set of ground contact elements, the second set of ground contact elements, the first set of signal contact elements, and the second isolation layer. The first isolation layer includes first and second isolation sublayers, where a first major surface of the first isolation sublayer forms the first major surface of the first isolation layer, and a first major surface of the second isolation sublayer forms the second major surface of the first isolation layer. The second isolation layer includes third and fourth isolation sublayers, where a first major surface of the third isolation sublayer forms the first major surface of the second isolation layer, and a first major surface of the first isolation sublayer forms the second major surface of the second isolation layer. A first interposer unit is formed directly adjacent to a second interposer unit.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, interposers can be constructed with differing numbers of interposer units, signal connectors, ground pins, ground planes, and the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An interposer connector for electrically coupling conductive structures formed on a first electronic component to conductive structures formed on a second electronic component, the interposer comprising:
   a first set of signal contact elements provided on a first major surface of a first isolation layer;
   a first set of ground contact elements provided on the first major surface of the first isolation layer, the ground contact elements being periodically placed between signal contact elements but electrically isolated from the respective signal contact elements; and
   a first conductive layer provided adjacent to and having a first major surface in contact with a second major surface of the first isolation layer, the first conductive layer being electrically connected to at least some of the ground contact elements by conductive conduits formed in the first isolation layer,
   wherein a spacing between the first set of signal contact elements and the first conductive layer is a function of a thickness of the first isolation layer, the thickness of the first isolation layer being selected in response to a given impedance response of the signal contact elements.

2. The interposer of claim 1, wherein each conductive conduit formed in the first isolation layer comprise a conductor formed on the side walls of a hole formed in the first isolation layer.

3. The interposer of claim 1, wherein each conductive conduit formed in the first isolation layer comprise a conductive via formed in a hole formed in the first isolation layer.

4. The interposer of claim 1, wherein the first conductive layer is configured as a ground plane and the first isolation layer comprises a printed circuit board substrate.

5. The interposer of claim 1, wherein each ground contact element is placed between pairs of signal contact elements, each pair of signal contact elements forming a differential signal pair.

6. The interposer of claim 5, wherein the signal contact elements in a differential signal pair are separated by a second spacing along the first major surface of the first isolation layer, the second spacing being selected in response to a given impedance response of the respective signal contact elements.

7. An interposer connector for electrically coupling conductive structures formed on a first electronic component to conductive structures formed on a second electronic component, the interposer comprising:
   a plurality of interposer units, wherein each interposer unit comprises:
   a first isolation layer, a first conductive layer, a first set of ground contact elements, a first set of signal contact elements, and a second isolation layer;
   the first isolation layer comprising one or more holes extending from a first major surface of the first isolation layer to a second major surface of the first isolation layer;

the first conductive layer provided adjacent to and having a first major surface in contact with the first major surface of the first isolation layer;

the first set of ground contact elements provided on the second major surface of the first isolation layer, wherein each of the first set of ground contacts elements are in electrical contact with at least the first conductive layer using a corresponding conductor provided in a hole of the one or more holes through the first isolation layer;

the first set of signal contact elements provided on the second major surface of the first isolation layer, wherein a signal contact element of the first set of signal contact elements is placed near to but electrically isolated from a ground contact element of the first set of ground contact elements; and the second isolation layer comprising one or more holes extending from a first major surface of the second isolation layer to a second major surface of the second isolation layer, wherein the second isolation layer is provided such that the first major surface of the second isolation layer is in contact with the first set of ground contact elements and the first set of signal contact elements;

wherein neighboring interposer units of the plurality of interposer units are formed directly adjacent to each other so that a second major surface of the second isolation layer of a first interposer unit is in contact with a second major surface of the first conductive layer of a neighboring interposer unit.

8. The interposer of claim 7, wherein at least some of the first set of ground contact elements of the first interposer unit are in electrical contact with the first conductive layer of the neighboring interposer unit using a corresponding conductor provided in a hole of the one or more holes through the second isolation layer.

9. The interposer of claim 7, wherein the signal contact element in each interposer unit is electrically isolated from the first conductive layers of the respective interposer unit and the neighboring interposer unit.

10. The interposer of claim 7, wherein the conductor formed in the hole comprises a conductive plating formed on side walls of the hole.

11. The interposer of claim 7, wherein the conductor formed in the hole comprises conductive via formed within the hole.

12. The interposer of claim 7, further comprising:
the first isolation layer comprises first and second isolation sublayers;
a first major surface of the first isolation sublayer forms the first major surface of the first isolation layer;
a first major surface of the second isolation sublayer forms the second major surface of the first isolation layer;
the second isolation layer comprises third and fourth isolation sublayers,
a first major surface of the third isolation sublayer forms the first major surface of the second isolation layer; and
a first major surface of the fourth isolation sublayer forms a second major surface of the second isolation layer, wherein the first conductive layer of a first interposer unit is formed between the first major surface of the first isolation sublayer of the first interposer unit and the first major surface of the fourth isolation sublayer of a neighboring interposer unit.

13. The interposer of claim 7, wherein a signal contact element of the first set of signal contact elements is configured to physically contact a conductive structure of the first electronic component, physically contact a conductive structure of the second electronic component, and electrically couple the conductive structure of the first electronic component to the conductive structure of the second electronic component.

14. The interposer of claim 7 wherein the first isolation layer and the second isolation layer each comprises a printed circuit board substrate.

15. The interposer of claim 7, wherein
a first set of one or more signal pads of a first semiconductor device are placed in contact with corresponding signal contact elements of the first set of signal contact elements;
a first set of one or more signal pads of a second semiconductor device are placed in contact with corresponding signal contact elements of the first set of signal contact elements; and
the interposer is configured to provide a signal path from a signal pad of the first semiconductor device to a signal pad of the second semiconductor device.

16. The interposer of claim 7 wherein the first conductive layer is configured as a ground plane.

17. The interposer of claim 16, wherein the first conductive layer is configured as the ground plane for a pair of neighboring interposer units.

18. An electronic device comprising:
a first electronic component comprising a first plurality of conductive structures on a first major surface of the first electronic component;
a second electronic component comprising a second plurality of conductive structures on a first major surface of the second electronic component;
an interposer, electrically coupling one or more of the first plurality of conductive structures to corresponding conductive structures of the second plurality of conductive structures, wherein the interposer comprises a plurality of interposer units, wherein each interposer unit comprises a first isolation layer, a first conductive layer, a first set of ground contact elements, a first set of signal contact elements, and a second isolation layer;
the first isolation layer comprising one or more holes extending from a first major surface of the first isolation layer to a second major surface of the first isolation layer;
the first conductive layer provided adjacent to and having a first major surface in contact with the first major surface of the first isolation layer;
the first set of ground contact elements provided on the second major surface of the first isolation layer, wherein each of the first set of ground contact elements are in electrical contact with at least the first conductive layer using a corresponding conductor provided in a hole of the one or more holes through the first isolation layer;
the first set of signal contact elements provided on the second major surface of the first isolation layer, wherein a signal contact element of the first set of signal contact elements is placed near to but electrically isolated from a ground contact element of the first set of ground contact elements;
the second isolation layer comprising one or more holes extending from a first major surface of the second isolation layer to a second major surface of the second isolation layer, wherein the second isolation layer is provided such that the first major surface of the second isolation layer is in contact with the first set of ground contact elements and the first set of signal contact elements, wherein neighboring interposer units of the plurality of interposer units are formed directly adjacent to each other so that a second major surface of the second isolation layer of a first interposer unit is in contact with a second major surface of the first conductive layer of a neighboring interposer unit.

19. The electronic device of claim 18, wherein at least some of the first set of ground contact elements of the first interposer unit are in electrical contact with the first conductive layer of the neighboring interposer unit using a corresponding conductor provided in a hole of the one or more holes through the second isolation layer.

20. The electronic device of claim 18, wherein the first conductive layer is configured as the ground plane for a pair of neighboring interposer units.

21. The electronic device of claim 18, further comprising:
the first isolation layer comprises first and second isolation sublayers;
a first major surface of the first isolation sublayer forms the first major surface of the first isolation layer;
a first major surface of the second isolation sublayer forms the second major surface of the first isolation layer;
the second isolation layer comprises third and fourth isolation sublayers,
a first major surface of the third isolation sublayer forms the first major surface of the second isolation layer; and
a first major surface of the fourth isolation sublayer forms a second major surface of the second isolation layer,
wherein the first conductive layer of a first interposer unit is formed between the first major surface of the first isolation sublayer of the first interposer unit and the first major surface of the fourth isolation sublayer of a neighboring interposer unit.

* * * * *